(12) United States Patent
Niemann (10) Patent No.: US 9,097,009 B2
(45) Date of Patent: Aug. 4, 2015

(54) STRONGER WALL SYSTEM

(71) Applicant: Michael Niemann, Tempe, AZ (US)

(72) Inventor: Michael Niemann, Tempe, AZ (US)

(73) Assignee: HercuTech, Inc., Phoenix, AZ (US)

( * ) Notice: Subject to any disclaimer, the term of this patent is extended or adjusted under 35 U.S.C. 154(b) by 0 days.

(21) Appl. No.: 13/706,349

(22) Filed: Dec. 5, 2012

(65) Prior Publication Data

US 2014/0026508 A1    Jan. 30, 2014

Related U.S. Application Data

(63) Continuation-in-part of application No. PCT/US2012/040079, filed on Jun. 4, 2012.

(60) Provisional application No. 61/493,345, filed on Jun. 3, 2011.

(51) Int. Cl.
| | | |
|---|---|---|
| *E04B 1/74* | (2006.01) | |
| *E04B 1/76* | (2006.01) | |
| *E04B 1/16* | (2006.01) | |
| *E04B 2/86* | (2006.01) | |

(52) U.S. Cl.
CPC ............... *E04B 1/7604* (2013.01); *E04B 1/165* (2013.01); *E04B 2/8629* (2013.01)

(58) Field of Classification Search
CPC ............. E04B 1/14; E04B 1/16; E04B 1/161; E04B 2/84; E04B 2/842; E04B 2/847; E04C 2/049; E04C 2/384; E04C 2/205
USPC .......... 52/309.12, 405.3, 404.1, 405.1, 405.4, 52/309.8, 309.7, 309.4
See application file for complete search history.

(56) References Cited

U.S. PATENT DOCUMENTS

| | | | |
|---|---|---|---|
| 1,451,144 A | 4/1923 | Decker | |
| 1,760,817 A | 5/1930 | Creamer et al. | |
| 4,190,999 A | 3/1980 | Hampton | |
| 4,924,641 A * | 5/1990 | Gibbar, Jr. .................. | 52/204.1 |
| 5,465,542 A | 11/1995 | Terry | |
| 5,469,674 A | 11/1995 | Morello | |

(Continued)

FOREIGN PATENT DOCUMENTS

| | | |
|---|---|---|
| CA | 2692723 A1 | 9/2009 |
| JP | 06-108556 A | 4/1994 |
| KR | 20-0290614 Y1 | 10/2002 |

*Primary Examiner* — Mark Wendell
(74) *Attorney, Agent, or Firm* — Barbara J. Luther; The Luther Law Firm, PLLC (57) ABSTRACT

A new prefabricated wall panel is the basic unit of a new, more efficient and stronger wall system. The wall panel is manufactured from a plurality of foam sections sized to leave vertical and horizontal voids into which concrete is later poured, each foam section having an inner and outer surface and two sides; and a plurality of fastening strips. The fastening strips are longitudinal metal strips being situated between the sides of two foam sections. Each fastening strip has two longitudinal fastening strips projecting perpendicularly to the longitudinal fastening strip and the fastening strips being adjacent to the outer surface of the two foam sections. The fastening strip also has a plurality of clearance holes in the longitudinal fastening strip, a plurality of embed tabs projecting from the edge opposite the fastening strips, each embed tab having at least one hole, and between each pair of embed tabs, a foam tab to hold the two inner sides of the foam sections in place and partially separate the foam sections from the concrete to be poured into a form.

7 Claims, 5 Drawing Sheets

(56) References Cited

U.S. PATENT DOCUMENTS

| | | |
|---|---|---|
| 5,930,958 A | 8/1999 | Stanley |
| 8,276,332 B2 * | 10/2012 | Henriquez ............ 52/220.2 |
| 2009/0178369 A1 | 7/2009 | Pilz et al. |
| 2009/0235598 A1 | 9/2009 | Miller |
| 2010/0058686 A1 * | 3/2010 | Henriquez ............ 52/220.2 |
| 2010/0088978 A1 | 4/2010 | Valle |
| 2013/0019549 A1 * | 1/2013 | Henriquez ............ 52/220.2 |

* cited by examiner

Fig. 2b
Top View:

Fig. 2c
Top View:

STRONGER WALL SYSTEM

TECHNICAL FIELD

The present invention relates to insulated wall systems and more particularly to a wall system that includes foam wall panels connected by fastening strips that are embedded in concrete studs and beams formed in situ within the wall panels.

BACKGROUND

Single and multifamily residential and light commercial building construction, especially in North America, has been constructed predominately with wood frame or concrete block techniques. Both of these methods have provided safe, secure, economical and code compliant structures for most of the twentieth century. However, the growing populations, pressure on the world's wood and energy resources, and ever increasing land resources utilized for landfill due to relatively short life cycles of conventional structures have caused society in general and the building construction industry to rethink new construction recyclability, and durability or a much extended life cycle all at a cost that is affordable on both a first cost and cost of occupancy basis. In addition, new construction technologies must be scaleable. Many new methods have been developed to address one or more of these critical issues but few if any address all of them. Most come at a cost premium or are impractical for implementation in mass volumes.

An efficient building envelope has been proven to be the most cost effective method of maximizing the overall efficiency of a building structure and continues to keep energy costs low over the lifetime of the structure. The building envelope provides the barrier between the interior conditioned space and the outdoor environment. The energy efficiency of a building envelope is measured in two ways: the efficiency of the insulation and minimizing air infiltration and air leakage through the building envelope. The exterior walls of a structure are a key component and a significant contributor to the overall energy efficiency of the building envelope.

Concrete wall and floor construction has been a long time standard construction material in most of the world for all types of structures. Over the past 25 years, insulated concrete forms (ICF) systems have gained popularity and widespread acceptance and use, principally in North America. ICF systems provide a method of building pour-on-site concrete walls without the use of capital intensive and labor intensive permanent concrete forms, but generally ICF technology does not adequately address the issues of scaleability and affordability. In particular, the current ICF systems require trained installers and large amounts of concrete to be poured.

SUMMARY OF THE INVENTION

A prefabricated wall panel has a. a plurality of foam sections sized to leave voids into which concrete is later poured, each foam section having an inner and outer surface and two sides; and b. a plurality of metal strips, the metal strips composed of a i. a longitudinal metal strip being situated within a slot in the outer section of foam, ii. two longitudinal fastening strips attached perpendicularly to a longitudinal metal strip, the fastening strips being adjacent to the outer surface of the two foam sections; iii. a plurality of clearance holes in the longitudinal metal strip; iv. a plurality of embed tabs projecting from the edge opposite the fastening strips; v. each embed tab having at least one hole; vi. between each pair of embed tabs, a foam tab to hold the metal strip assembly in place within the foam.

A partially prefabricated wall system is made from a plurality of wall panels, each panel is manufactured from i. a plurality of foam sections sized to leave voids into which concrete is later poured, each foam section having an inner and outer surface and two sides; ii. a plurality of metal strips, the metal strips are fabricated with a) a longitudinal metal strip being situated within a slot in the outer section of foam, b) two longitudinal fastening strips attached perpendicularly to a longitudinal metal strip, the fastening strips being adjacent to the outer surface of the two foam sections; c) a plurality of clearance holes in the longitudinal metal strip; d) a plurality of embed tabs projecting from the edge opposite the fastening strips; e) each embed tab having at least one hole; f) between each pair of embed tabs, a foam tab to hold the metal strip assembly in place within the foam. The system also has a track into which one end of the wall panels is placed; a cap which fits over the upper ends of a plurality wall panels; and concrete poured into the top of the panels to fill the voids in the panels.

BRIEF DESCRIPTION OF THE DRAWINGS

For a further understanding of the objects and advantages of the present invention, reference should be had to the following detailed description, taken in conjunction with the accompanying drawing, in which like parts are given like reference numbers and wherein:

FIGS. 2a and 2b are various views of the inventive, preferably one-piece fastening strip that is the core of the inventive wall. FIG. 2b is a top view.

DETAILED DESCRIPTION

My system provides an efficient method of reinforcing pour-in-place concrete walls. This application uses rigid foam materials (typically expanded polystyrene or EPS) that serve as the poured concrete forms in lieu of temporary, site-constructed wood-based formwork or removable metal forms. These EPS forms remain in place after the concrete has been placed and cured, providing highly efficient rigid foam insulation to the structure. Other examples of foam suitable include, but are not limited to, extruded polystyrene (XPS) and rigid polyurethane foams, and other similar materials.

My new system also saves significant amounts of labor because the individual panels are manufactured to match the construction plans such that a plurality of numbered panel components are produced to the precise dimensions matching the construction plans such that when panels are placed in order at the job site these individual panel components match the construction plans for the project with straight wall sections, corners and all window and door openings in place. All components are fabricated to close tolerances within a factory and are ready to install without jobsite modification. This saves considerable labor, reduces the need for skilled workers, provides consistency, facilitates scaleability and eliminates job site clutter. The metal fastening strips also function as the vertical reinforcing for the concrete, together forming a composite action and eliminating the vertical reinforcing bar common to other reinforced concrete wall constructions. The composite relationship with the metal fastening strips partially embedded within the concrete is structurally more efficient than utilizing conventional reinforcing bar, resulting in my system being 50% stronger with 35% less concrete than conventional reinforcing method thereby reducing the amount of concrete needed and proportionally the cost of the concrete. The elimination of the vertical rebar further reduces material cost and installation labor. Conventional reinforcing bar is typically limited to two horizontal reinforcing bars that are placed within a continuous concrete beam at the top of the wall. A lower concrete beam at the bottom of the wall acts as a base and a connection point to the slab or foundation whereupon the wall is constructed. Before the concrete is poured the foam in the walls acts as a form for the concrete, and after the concrete is placed the foam provides highly efficient insulation, an air and water infiltration barrier and a mounting surface for interior and exterior finishes such as drywall, plaster, stucco, stone, bricks or siding. The wall is also an excellent sound attenuator. With these innovations, a safe, quiet, long-lasting concrete structure can be built economically and in less time.

Figure 1A:
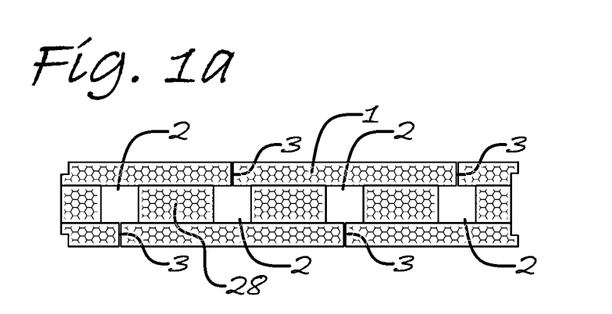
FIGS. 1a, 1b and 1c show the finished appearance of the foam component of a wall built with the inventive system, from the top (FIG. 1a), from the outside or inside (FIG. 1b) and from a side view (FIG. 1c)
Figure 1B:
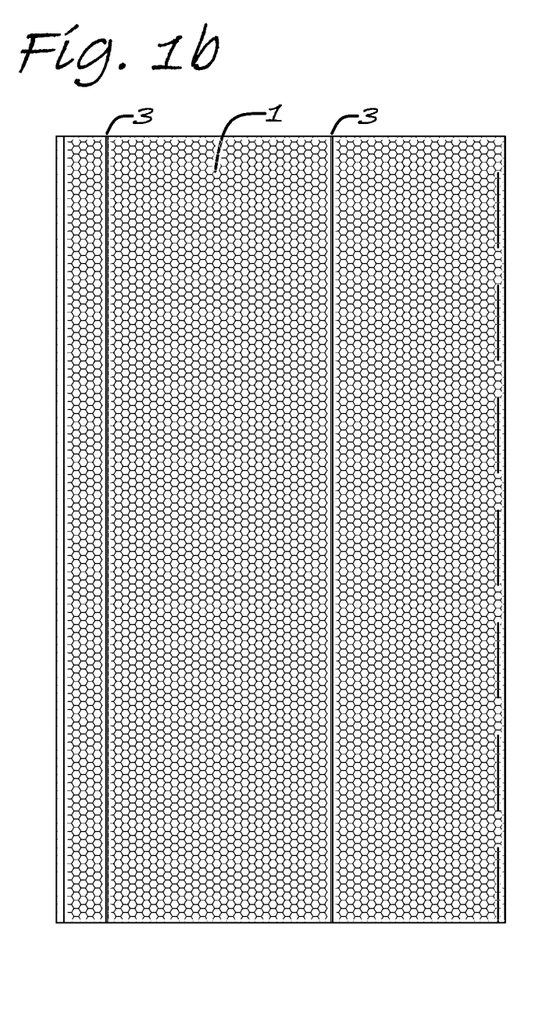
Figure 1C:
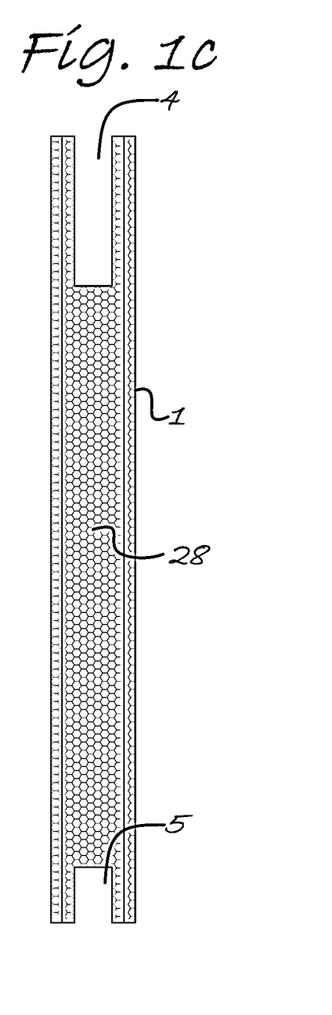
Figure 2A:
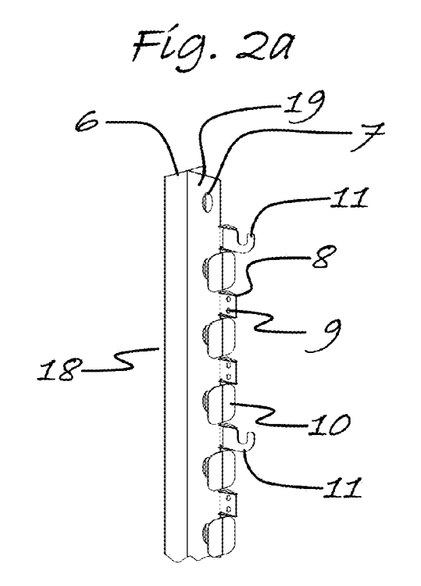
FIG. 2a is a side perspective view of the strip, showing the integral tabs that embed in the concrete to replace rebar and the hooks that support horizontal rebar in the system.
Figure 2B:
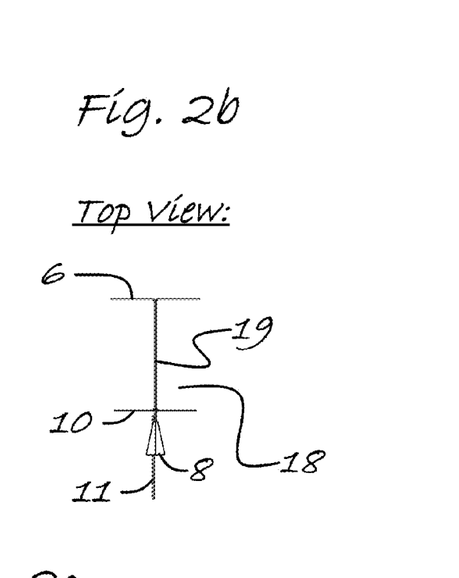
Figure 2C:
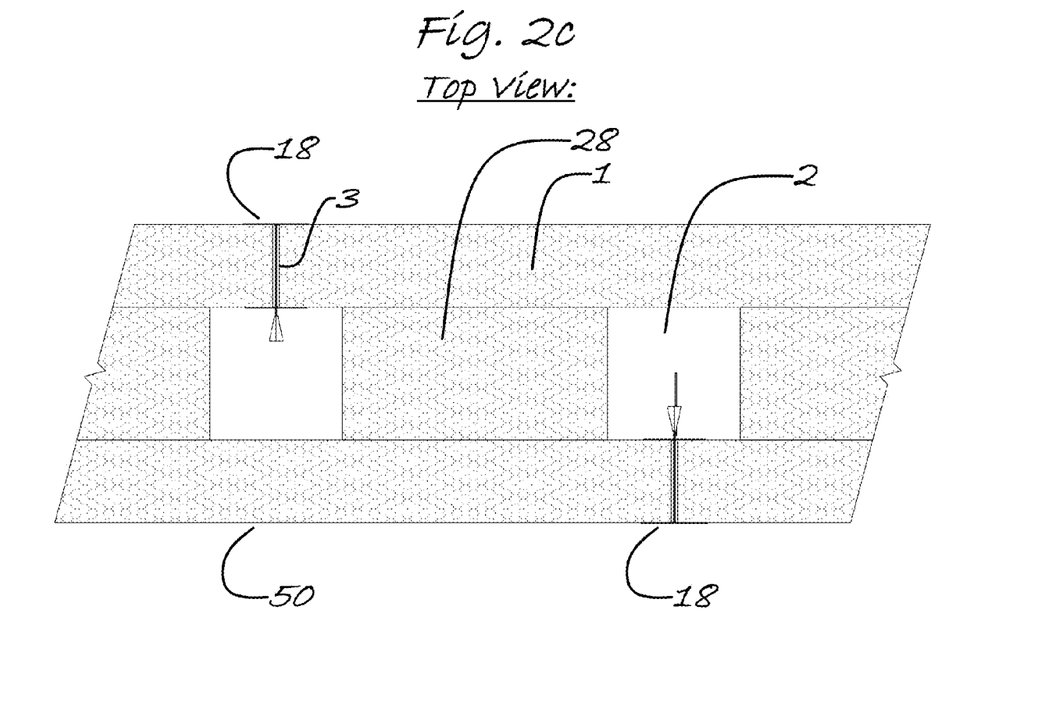
FIG. 2c shows a top view of the foam wall component with fastening strips in place.
Figure 3:
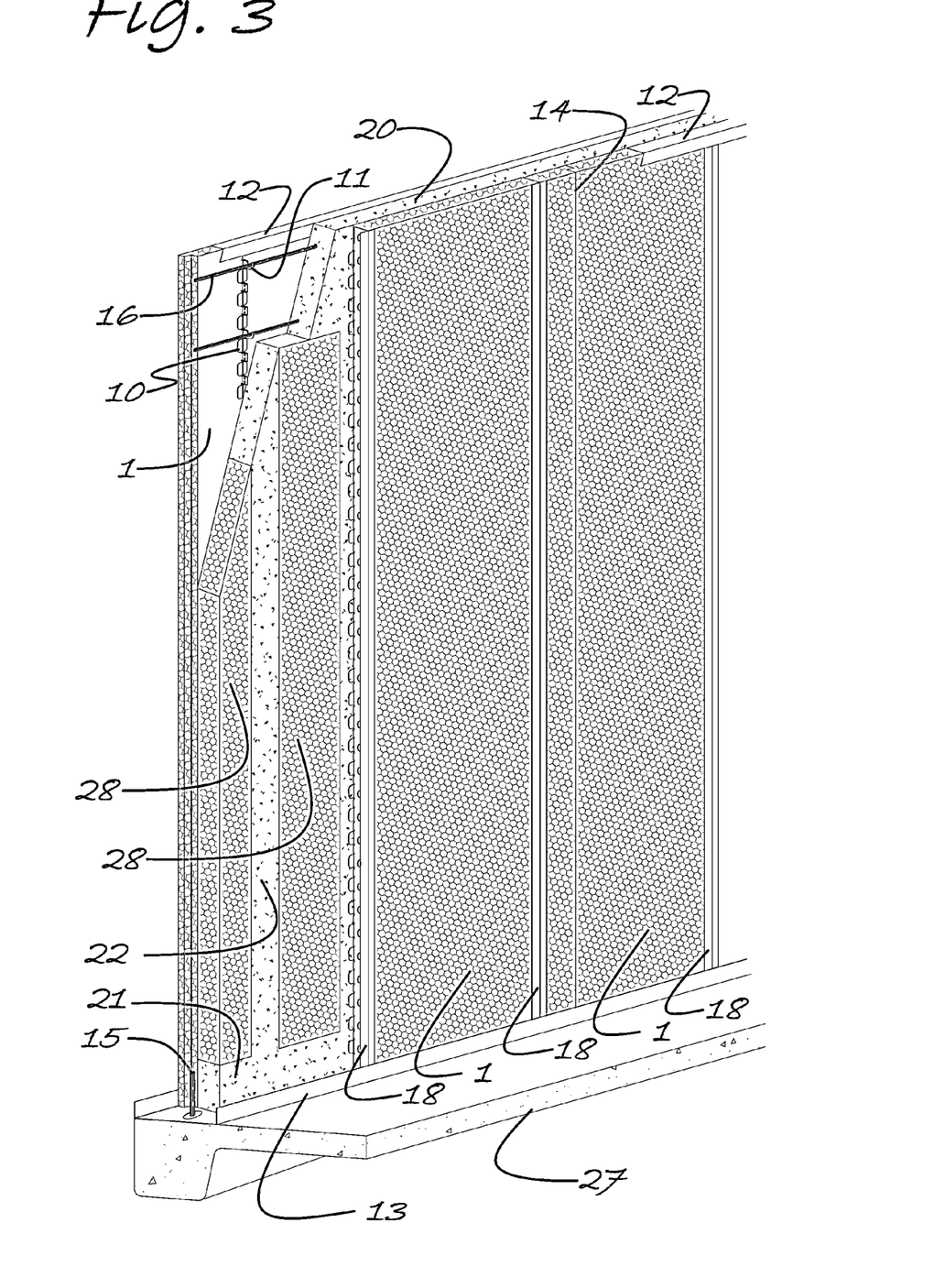
FIG. 3 is a perspective, cutaway view of a section of the wall after the panels are set up and the concrete studs and beams in place also depicting the optional integral impact barrier and finish coat.

The basic inventive system is shown in FIGS. 1-3. FIG. 1a is a view from the top of a partially constructed panel 50, showing the rigid foam material 1 and 28 which makes up much of the volume of the panel, FIG. 1c except for the longitudinal channels 2 and the horizontal channels 4 and 5 FIG. 1c into which concrete is poured onsite to form concrete studs 22, an upper concrete beam 20 and a lower concrete beam 21. Either side of the panel 50 includes tongue and groove notches 14 for alignment with adjacent panels facilitating an accurate fit between the panels and a straight wall. Preferably, the foam component is cut out from a single piece of foam utilizing computer controlled hot wire cutting machinery. Inherent to this process is the formation of a kerf or a slot 3. The slots 3 are typically juxtaposed from the front side to the back or opposing side of the foam panel aligning to a vertical void 2 into which concrete is poured. As can be seen in FIG. 1b (a front view of a wall panel 50), the rigid foam material 1 and the slots 3 extend the full height of the panel. Additional internal foam spacers 28 are formed between the two foam panels 1 as part of the foam cutting process and the removal of the foam that forms vertical channels 2 and horizontal channels 4 and 5 within the wall panel 50. FIG. 1c is a side view of a panel 50 showing foam material 1 and the upper channel 4 which is later filled with concrete to create a continuous upper beam 20 at the top of the length of the wall. Likewise, the lower channel 5 at the bottom of the panel 50 is filled with concrete to form lower beam 22 that runs the length of the wall.

Unique to my technology is the use of a plurality of fastening strips 18 that are positioned within the foam panel 1 as can be seen in FIG. 2c by sliding the fastening strips 18 into the slots 3 such that the outside surface of the metal fastener strip 6 is exposed on or nearly flush with the outer surface of the foam panel 1 and the tabs 10 grip the inside wall of the outer foam 1 accurately positioning and securing the fastener strips 18 in place within the foam with embed tabs 8, integral to the fastener strips 18 positioned within the void 2 connected to and embedded within the concrete. Preferably the fastening strips 18 are formed from a single piece of metal.

FIGS. 2a and 2b show two views of fastening strips 18. The fastening strips 18 include a first, external flange 6, and second internal flange 10 and a third connecting flange 19. External flange 6 and internal flange 10 are generally parallel to each other with the connecting flange 19 being positioned generally perpendicular to the external 6 flange and internal flange 10. The fastening strips 18 are generally configured as an assembly of back-to-back "C" shaped channels into which the foam panels 1 are placed. The external flange 6 can serve as a as a fastening surface for drywall, siding, stucco, brick or stone as well as connecting points for wall-hung cabinets, and ledger boards. The external flange 6 is positioned to be flush or nearly flush to the exterior surfaces of the foam material 1. At the factory, the fastening strips 18 are inserted into the slots 3 within the foam panels 50 and positioned such that the fastening strips 18 run parallel to the vertical axis of the panel 50. The internal flange 10 can be formed as a series of small sections 10a, 10b etc. as shown in FIG. 2a or it could be formed as a single contiguous piece. In the embodiment shown in FIGS. 2a and 3, a series of embed tabs 8 protrude beyond the surface of the internal flange 10 in a generally perpendicular fashion. Once the panel 50 is assembled, the embed tabs 8 protrude into the cavity voids where the concrete is to be poured.

The embed tabs 8 are optionally equipped with double attachment holes 9 to which hooks 11 can be attached by inserting knobs on the hook holder into the attachment holes 9. The hooks 11 are optionally positioned in the factory into concrete void 4 (FIG. 1c) for placement of horizontal reinforcing bar (rebar) after the panels are stood up in situ. These embedded tabs 8 may be evenly spaced along the vertical axis of the fastening strip 18 and perpendicular to the horizontal axis. The connecting flange 19 may include one or more holes 7 that can be used to run electrical wiring, plumbing or anything else that is suited to be positioned internal to the wall.

Also unique to my invention is the use of these fastening strips 18 to serve as tension reinforcement for the concrete eliminating the requirement for most of the conventional vertical reinforcing bars (rebars) that concrete wall systems typically require. Tension loads in the concrete studs 22 are transferred to the vertical fastening strips 18 via the embed tabs 8 that are integral to the fastening strips 18. This method of reinforcing concrete allows tension loads to be counteracted outside of the concrete and at a location where a greater mechanical advantage can be attained than with conventional reinforcing bar that is totally embedded within the concrete. Thus, my inventive wall gains increased strength with less concrete. The combination of concrete and the partially embedded fastening strips 3 result in a composite assembly. Because less rebar installation is performed on site, there is less labor, materials and time in building the walls, containing these fastening strips 18.

Specifically, the fastening strips 18 are an important component to my invention as they serve several purposes within the invention. For example, the fastening strips 18 provide a fastening surface 6a on the outer side of the external flange 6 for materials like drywall and plaster lath on interior and exterior finishes like stucco (with lath), siding, brick, and stone veneers. In the case of the inventive pour-in-place concrete walls, the fastening strips 18 run vertically from the bottom of the wall panel to the top of the wall panel form and on both the interior side of the wall and alternatively on the exterior side of the wall.

As explained in more detail below, components of my technology, including but not limited to walls and adaptable to floors and ceiling/roofs) all share the use of my inventive integral reinforcing and fastening system (FIGS. 1*a*-3) that eliminates the requirement for most of the conventional rebar within poured concrete walls and floor systems by transferring tension loads to formed fastening strips 18 that are connected with and partially embedded in the concrete component of the wall system. In addition to providing the tension reinforcement to the concrete, the fastening strips 18 add strength to the foam panel 50 while concrete is being placed and act as the connector between the concrete and foam material/panels. These strips also function as a fastening point for interior and exterior veneer surfaces and as mounting points for cabinets, electrical boxes, plumbing and other mechanical items.

Our preferred mode of manufacturing the inventive panels uses a computerized design and manufacturing system and structural analysis system that accurately and efficiently produces a wall building kit composed of a series of interlockable wall panel components manufactured to meet the specific architectural design and engineering parameters of a building envelope. The kits include precut wall height panels for straight and curved wall sections, panels sized to fit around windows and doors and around corners of any angle. The computerized software design system is integrated with a computerized manufacturing system to yield a finished product that is precise, accurate and economical. The building envelope kits are designed for ease of installation by general construction labor with minimal training. No skilled labor is required, as the panel components are manufactured to eliminate on-site modification of the panel system, with only basic tools required.

The core technology of the invention and common to each of its applications are panels 50 with a series of formed fastening strips 18 that serve multiple purposes. The fastening strips 18 are preferably manufactured from light gauge galvanized steel and are generally configured as an assembly of back-to-back "C" shaped channels that have a series of metal embed tabs 8 that protrude from the joint between the two "C" channels on one side of the assembly only. The two-piece assembly is spot welded, riveted together or otherwise permanently attached. An alternative design is the strip assembly manufactured and formed from one piece. The one-piece alternative does not require rivets and the embed tabs 8 are formed out of the same piece of material. The fastening strips can also be manufactured from other types of metal, structural plastics, composites and the like.

The embed tabs 8 are designed and positioned such that as the concrete is poured into the forms, the tabs 8 are surrounded by concrete and when the concrete cures, a permanent bond is created between the concrete and the tabs, thereby permanently bonding the strip assembly 18 to the concrete. These tabs 8 are designed to allow the concrete to mechanically grab onto and permanently hold the tabs 8 in place. Through the embed tabs 8, the curing concrete forms a mechanical bond with the strips 18. This bond between the concrete and the tabs 8 transfers tension loads within the concrete to the strips 18. Properly engineered, the combination of the concrete studs 22, beams 20, 21 and the fastening strips 18 creates a composite system with the concrete acting as the compression component of the composite assembly and the fastening strips 18 acting as the tension member of the assembly. The fastening strips 18 act as the vertical reinforcement within a poured concrete wall, eliminating much of the need for conventional steel rebar.

Our structural analysis of this composite system shows that a wall can be 50% stronger while using 35% less concrete when compared to a concrete wall of similar scale built utilizing conventional steel rebar reinforcing. This dramatic improvement results from our optimal placement of the tension member (fastening strip 18) of the composite assembly outside of the concrete where the greatest mechanical advantage is realized.

In the inventive wall systems, the fastening strips 18 provide a substitute for conventional vertical reinforcing bars within the system, provide a joiner strip and seal to fill vertical slots 3 in the foam material/panel 1 and provide a fastening surface 6*a* for interior and exterior veneer surfaces like drywall, siding and others, as well as mounting holes/points 7 for cabinets, electrical boxes, plumbing and other mechanical items. The fastening strips 18 extend from the base of the wall form panel 50 to the top of the wall form panel and are located on the centerline of the individual concrete studs 22 with one strip 18 located per concrete stud 22. The strips 18 are parallel to each other and generally alternate from the interior side of the wall to the exterior side such that the spacing of the strips on each side of the wall system is regularly spaced to facilitate the installation of drywall on interiors and other finishes on the exterior.

Example 1

Panelized Foam Form for Wall System

The inventive building system is manufactured of lightweight wall panels 50 (containing voids into which concrete is poured). The preferred weight of a panel 50 with 4 metal fastener strips installed and of a width of four feet and height of 8 feet is about 60 pounds. We have found this is easily manageable by one or two workers. A two-person team is preferred because the lightweight wall panels are affected by breezes. Generally, the voids within the individual panels (e.g. the longitudinal channels 2, upper channel 4 and lower channel 5) are designed so that the resulting shape of the concrete after pouring and curing results in a continuous horizontal bond beam at the bottom 21 and the top 20 of the wall with regularly spaced vertical concrete columns/studs 22 adjoining the lower 21 and upper 20 horizontal beams. The shape of these concrete studs and beams can be square, round or rounded, rectangular, trapezoidal or even polyhedral in shape, or a combination thereof.

Panelized. The foam forms are manufactured according to the height of the wall specified in the building plans. For example, if the construction plans call out a 9' wall height, then the panel form components will be manufactured 9' tall. Walls taller than one story in height can be constructed by stacking tiers of panels on top of each other. If the wall length is not a multiple of four feet, a narrower panel is provided.

Customized Each form panel 50 is manufactured and specific to the building plans for a given structure. Each panel 50 to fits within a specific position in the wall or walls being constructed. Each panel 50 or group of panels is designed to form straight wall sections, curved wall sections, corners, window openings and/or door openings in order to precisely match the desired final wall configuration as specified in the construction drawings. In other words, a series of panels 50 are manufactured for each individual installation, and as such this series of panels forms a "kit" which is shipped to the jobsite and is set up in sequence to form the desired wall configuration.

Structure. The configuration of the final concrete structure formed by the panels 50 within the walls is not a solid concrete wall but consists of a concrete base beam or curb 21 at the bottom of the wall, a concrete bond beam 20 at the top of the wall and vertical concrete columns 22 between the curb and the bond beam. The system allows for window and door openings to be placed at any point within the system and all window and door openings are surrounded by concrete.

Fastening Strips. Vertical fastening strips 18 (the "strips") for attaching finishes to the system are integral to the system. These strips provide a hard fastening point 6a for drywall and cabinets on the interior and stucco, siding, brick and stone veneers on the exterior. These strips are flush or nearly flush with the surface of the forms, and their spacing can be varied to accommodate the maximum allowable spans for drywall and other materials.

In contrast with wood houses in which extra wood planks are put around the windows and doors, I have designed the fastening strips 18 for paired strip 18 placements around the windows and doors. The paired strips are attached to each other by segments/spacers 17 whose ends have stubs that are inserted into the hook holes 9. All window and door openings are surrounded by metal or plastic fastener strips 3 to facilitate the finishing of these openings.

Example 2

Installation of the Wall System

Figure 4:
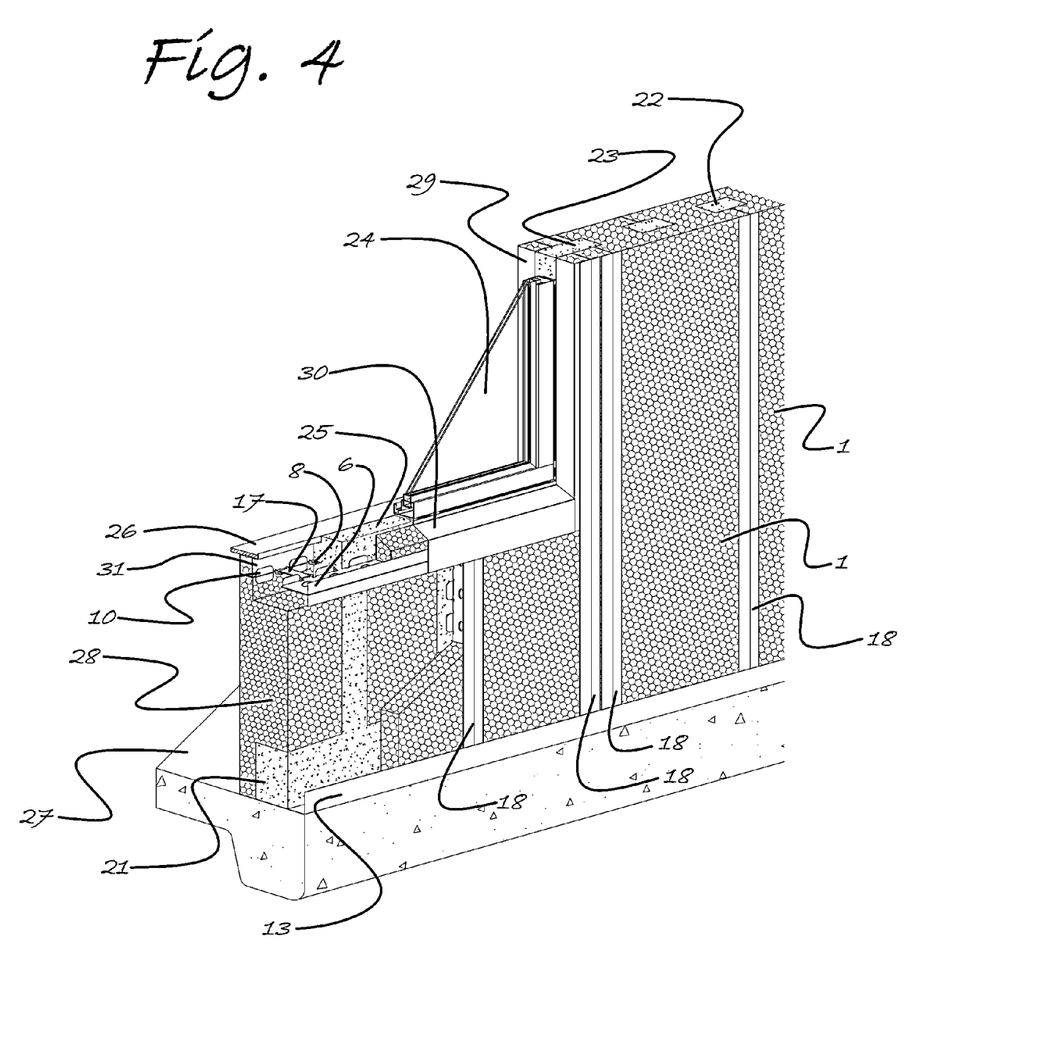
FIG. 4 is a cutaway, perspective view of the window section of a wall after the panels are set up, the concrete studs and beams are formed and a window installed.

FIGS. 3-4 show a cutaway of a wall and facilitate understanding of the installation. At the bottom is the floor slab 27 on which a metal track 13 sits. Rebar 15 is embedded in the slab 27 and pierces track 13. A metal track 13 or parallel retainer angles are also fastened to a footing, stemwall or floor slab 27. This track 13 defines the position of the wall and receives the bottom end 1a of the lightweight panels. The rebar 15 or similar material affords a means of connection between the wall and the foundation or floor slab. Placement, size and location of these items are pre-determined by structural engineering plans and placed within the concrete prior to or when the foundation and slab are poured.

The bottom end 1a of the lightweight foam panels 50 are set in place within the metal track 13 on the foundation according to the building plans and the job-site drawings. Panels are provided with markings so that the installer can identify the panel components and their positioning on the project diagram and relative positioning to other components. The panels 50 are aligned and straightened. The sides of each panel 50 have notches 14 so the panels accurately align to one another.

Metal caps 12 are installed at the top of the wall. These caps 12 are manufactured preferably in 10' or longer lengths than the combined widths of several panels 50 and serve to align multiple panels and insure straighter walls. The caps 12 are lightweight metal "C" channels designed to fit over the top of the foam forms at the top of both the interior and exterior sides of the wall. The caps 12 can be cut to cover shorter walls or to fill in gaps in longer walls. The caps 12 can also be formed from other metals, plastic and composite materials.

Several sections of wall panels 50 are aligned with the bottom track 13 and together with the top caps 12. The top caps 12 are screwed into place secured to the fastening strips 50 while alternating with the installation of bracing (not shown) which are kickers that typically run from the top of the wall to a ground stake on the exterior of the structure or tied to the slab or foundation on the interior side of the wall. Preferably there is a brace at each corner in both directions and at a maximum of 10' spacing over the length of any wall section. Bracing or kickers should have an inline turnbuckle for final wall adjustment.

Attached to the fastening strip 18 are hooks 11 that act as cradles into which horizontal reinforcing bar 16 is positioned in horizontal void 4 prior to the placement of the concrete. Generally engineering calls for two horizontal reinforcing bars 16 within the upper beam 20. These horizontal reinforcing bars 16 run continuously around the top perimeter of the wall according to the structural engineering requirements specific to the building project. Because these hooks 16 and guides are strong enough to hold the position of the rebar against the forces of the concrete pour, no additional wire ties are required, eliminating the labor, materials and costs of tying off the rebar.

A concrete slurry of predetermined strength and specification is pumped into the wall panels 50 from the top of the walls. A preferred concrete mix has a yield strength of 3,000 PSI at a slump of 4' to 5' at the discharge end of the hose. I also recommend the use of a hydraulic group pump with a maximum of a 2" delivery line to facilitate easy and safe handling of the concrete. As the concrete is pumped into the panel forms 50, the concrete may be vibrated to minimize any voids or air entrapment within the wall system. The concrete and rebar form the structural component of the wall; and the foam material/panels 50, which initially served as the form for the concrete, now stay in place and function as the wall insulation and a mounting surface for interior and exterior finishes.

After the concrete is adequately cured, any bracing that was installed may be removed and construction may continue.

Example 3

Installing a Window

Figure 5A:
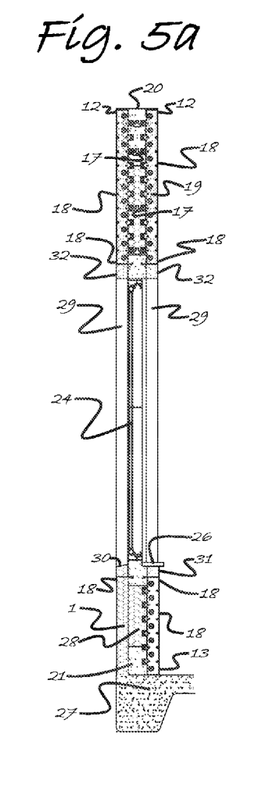
FIGS. 5a and 5b are a side section view and a front view respectively of the window in place in the constructed wall.
Figure 5B:
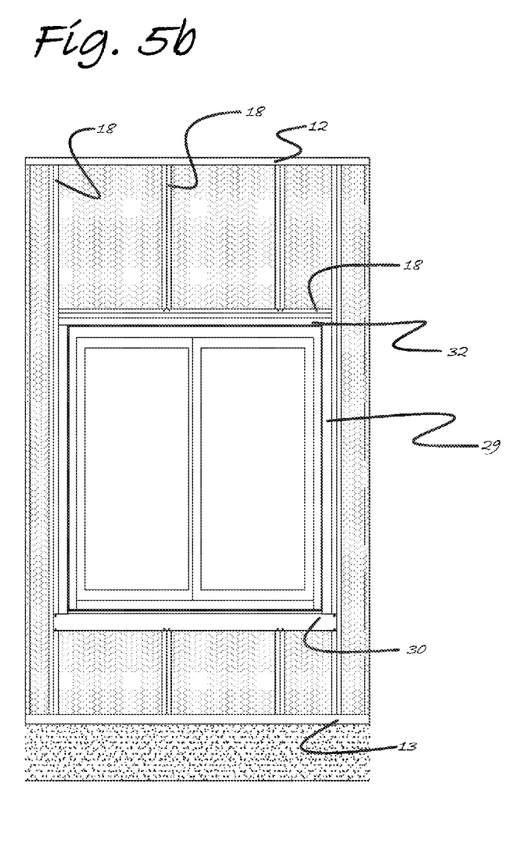

FIGS. 4 and 5a and 5b show a window 24 in situ in the inventive wall system. The sides of the window opening have been premade for the window, and all that needs to be done is the installation of the window, inside window sill and outside finish sill. At the upper right of the partial window shown in FIG. 4 are two pairs of fastening strips 18 and between them is a double-width concrete stud 23. This shows the flexibility that is inherent to the inventive wall system. Single or multiple pairs of opposing fastening strips may be required to transfer loads of larger width openings for example a 5' width opening might require two sets of opposing fastening strips 18 while a 12' wide opening might require 4 sets of opposing fastening strips 18 with the number of pairs of strips 18 on each side of the window being determined by the height of the wall, the size of the opening and the maximum expected wind conditions at the construction site. At the lower edge of the window opening, there are two lateral, facing fastening strips 18 connected by a segment/spacer 17 and surrounded with foam panels 1 that constitutes the form for the concrete sill 25 under the window. Window and door openings are generally "bucked out" utilizing a temporary plywood or metal buck that is installed at the factory as a part of the manufacturing process. Permanent "stay-in-place" plastic, metal or a combination thereof bucking may also be utilized. The bucking provides added strength to the window opening while the concrete is being placed and keeps the concrete from spilling outside of the forms, thus maintaining the final dimensions of the openings. After the concrete is placed and adequately cured, the temporary window and door bucks are removed and returned to the manufacturer for reuse while permanent bucking remains in place, and the window or door is installed within the opening. If the window is to be surfaced mounted it shall be fastened to the header fastening surface 18 and jamb fastening surface 29 and the window sill 30. When the window is installed in a recessed position as shown in FIG. 5 the window is fastened through the window frame into the concrete that surrounds the window opening with concrete anchors as specified by the window manufacturer. A decorative window sill 26 such as wood tile or stone may be included on the interior side to complete the window 24 and secured to the interior sill 30.

Although specific embodiments have been illustrated and described herein, those of ordinary skill in the art will appreciate that any arrangement calculated to achieve same purposes can be substituted for the specific embodiments shown. This disclosure is intended to cover any and all adaptations or variations of various embodiments of the invention. It is to be understood that the above description has been made in an illustrative fashion, and not a restrictive one. Combinations of the above embodiments, and other embodiments not specifically described herein will be apparent to those of skill in the art upon reviewing the above description. The scope of various embodiments of the invention includes any other applications in which the above structures and methods are used. Therefore, the scope of various embodiments of the invention should be determined with reference to the appended claims, along with the full range of equivalents to which such claims are entitled.

In the foregoing description, if various features are grouped together in a single embodiment for the purpose of streamlining the disclosure, this method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims, and such other claims as may later be added, are hereby incorporated into the description of the embodiments of the invention, with each claim standing on its own as a separate preferred embodiment.

The invention claimed is:

1. A partially prefabricated wall system comprising:
    a. a plurality of wall panels, each panel comprising
        i. a plurality of foam sections sized to leave voids into which concrete is later poured, each foam section having an inner and outer surface and two sides;
        ii. a plurality of metal strips, the metal strips comprising
            a) a longitudinal metal strip being situated between the sides of two foam sections,
            b) two longitudinal fastening strips attached perpendicularly to the longitudinal metal strip, the fastening strips being adjacent to the outer surface of the two foam sections;
            c) a plurality of clearance holes in the longitudinal metal strip;
            d) a plurality of embed tabs projecting from an edge opposite the fastening strips;
            e) each embed tab having at least one hole; and
            f) between each pair of embed tabs, a foam tab to hold the two inner foam section in place and partially separate the foam from the concrete to be poured into a form;
    b. a track into which one end of the wall panels is placed;
    c. a cap which fits over the upper ends of a plurality wall panels; and
    d. concrete poured into the top of the panels to fill the voids in the panels.

2. The partially fabricated wall system of claim 1 further including additional foam disposed between the inner surfaces of the foam section to form a longitudinal channel that is centered around the embed tab of the fastening strip.

3. The partially fabricated wall system of claim 1 further including additional foam disposed between the inner surfaces of the foam sections to form a top horizontal channel in the foam section accommodating an upper concrete beam and a bottom horizontal channel in the foam section accommodating a lower concrete beam, both the top channel and bottom channel being in fluid communication with the longitudinal channel.

4. The partially fabricated wall system of claim 3 wherein the concrete column, the upper concrete beam and the lower concrete beam are formed in situ by pouring a concrete slurry into the longitudinal channel, the top channel and the bottom channel.

5. The partially fabricated wall system of claim 4 wherein a complete wall is constructed using a plurality of the prefabricated panels secured within the retaining track and includes the upper concrete beam, the lower concrete beam and at least two concrete columns each located adjacent a longitudinal side end of the wall.

6. The partially fabricated wall system of claim 5 wherein the concrete columns located at the side ends of the wall are double concrete columns formed using two adjacent fastening strips with the embed tabs from two fastening strips being embedded within the double concrete column.

7. The partially fabricated wall system of claim 5 wherein a window is installed within the wall using a double concrete column located adjacent a longitudinal side of the window and two fastening strips disposed horizontally and located adjacent a bottom end of the window, the two horizontal fastening strips being adjacent to each other with embed tabs extending into the space created by the adjacent fastening strips, the two horizontal fastening strips being connected by a spanner, each of the two fastening strips having foam sections disposed between the longitudinal fastening strips and foam tabs, and a horizontal concrete sill is disposed between the inner surfaces of the foam section.

* * * * *